US012794438B2

(12) United States Patent
Nakamura et al.

(10) Patent No.: US 12,794,438 B2
(45) Date of Patent: Nov. 10, 2026

(54) Acoustic Wave Device Including Scandium-Containing Aluminum Mitride Film

(71) Applicant: Murata Manufacturing Co., Ltd., Nagaokakyo (JP)

(72) Inventors: Kentaro Nakamura, Nagaokakyo (JP); Tetsuya Kimura, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 578 days.

(21) Appl. No.: 18/381,677

(22) Filed: Oct. 19, 2023

(65) Prior Publication Data

US 2024/0072757 A1 Feb. 29, 2024

Related U.S. Application Data

(63) Continuation of application No. PCT/JP2022/022285, filed on Jun. 1, 2022.

(30) Foreign Application Priority Data

Jun. 8, 2021 (JP) ................................ 2021-095984

(51) Int. Cl.
*H03H 9/02* (2006.01)
*H03H 9/13* (2006.01)
*H03H 9/17* (2006.01)

(52) U.S. Cl.
CPC .... *H03H 9/02133* (2013.01); *H03H 9/02031* (2013.01); *H03H 9/02102* (2013.01);
(Continued)

(58) Field of Classification Search
CPC ........... H03H 9/02133; H03H 9/02031; H03H 9/02102; H03H 9/02228; H03H 9/131;
(Continued)

(56) References Cited

U.S. PATENT DOCUMENTS 7,795,788 B2 * 9/2010 Yokota ............... H03H 9/14541 333/194
10,332,958 B2 * 6/2019 Yoshikawa ............. B32B 15/04
(Continued)

FOREIGN PATENT DOCUMENTS

JP 2009010926 A 1/2009
JP 2011015148 A 1/2011
(Continued)

OTHER PUBLICATIONS

International Search Report in PCT/JP2022/022285, mailed Aug. 23, 2022, 3 pages.
(Continued)

*Primary Examiner* — Emily P Pham
(74) *Attorney, Agent, or Firm* — Keating & Bennett, LLP

(57) ABSTRACT

An acoustic wave device includes a ScAlN film including a first and second principal surfaces opposed to each other, and a first excitation electrode on the first principal surface and a second excitation electrode on the second principal surface. The ScAlN film includes a first electrode vicinity region at a vicinity of the first electrode, a second electrode vicinity region at a vicinity of the second electrode, and a central region. Assuming that, among a longer diameter and a shorter diameter of a crystal grain in the ScAlN film when ellipse approximation is applied to the crystal grain, the shorter diameter is a crystal grain size, and an average value of the crystal grain size in each region is an average grain size $R_{avg}$, the $R_{avg}$ of the first electrode vicinity region is smaller than the $R_{avg}$ of the central region.

20 Claims, 6 Drawing Sheets

(52) U.S. Cl.
CPC ........ *H03H 9/02228* (2013.01); *H03H 9/131* (2013.01); *H03H 9/173* (2013.01); *H03H 9/175* (2013.01); *H03H 9/176* (2013.01)

(58) Field of Classification Search
CPC ........ H03H 9/173; H03H 9/175; H03H 9/176; H03H 9/02574; H03H 9/02015
See application file for complete search history.

(56) References Cited

U.S. PATENT DOCUMENTS

| | | | |
|---|---|---|---|
| 2008/0296529 | A1 | 12/2008 | Akiyama et al. |
| 2012/0107557 | A1 | 5/2012 | Akiyama et al. |
| 2015/0084719 | A1 | 3/2015 | Umeda |
| 2019/0363243 | A1 | 11/2019 | Tanaka et al. |

FOREIGN PATENT DOCUMENTS

| | | | |
|---|---|---|---|
| JP | 2015134955 | A | 7/2015 |
| JP | 2019207910 | A | 12/2019 |
| JP | 2020092322 | A | 6/2020 |

OTHER PUBLICATIONS

Written Opinion in PCT/JP2022/022285, mailed Aug. 23, 2022, 3 pages.

* cited by examiner

Acoustic Wave Device Including Scandium-Containing Aluminum Mitride Film

CROSS REFERENCE TO RELATED APPLICATIONS

This application claims the benefit of priority to Japanese Patent Application No. 2021-095984 filed on Jun. 8, 2021 and is a Continuation Application of PCT Application No. PCT/JP2022/022285 filed on Jun. 1, 2022. The entire contents of each application are hereby incorporated herein by reference.

BACKGROUND OF THE INVENTION

1. Field of the Invention

The present invention relates to an acoustic wave device including a scandium-containing aluminum nitride film.

2. Description of the Related Art

Conventionally, an acoustic wave device which uses a scandium (Sc)-containing aluminum nitride (AlN) film (that is, a ScAlN film) as a piezoelectric film is known. For example, Japanese Unexamined Patent Application Publication No. 2009-010926 discloses a BAW device which uses an aluminum nitride film to which scandium is added. In the BAW device, electrodes which apply an alternating-current electric field are provided on an upper surface and a lower surface of the ScAlN film. Moreover, a hollow portion is provided at a lower side of the ScAlN film. Furthermore, US2015/0084719 A1 also discloses a BAW device having a similar structure.

SUMMARY OF THE INVENTION

In the conventional acoustic wave device which uses the aluminum nitride film where Sc is added, piezoelectricity is improved as a concentration of Sc increases. However, when the concentration of Sc increases, the ScAlN film may be warped or peeled off. Therefore, piezoelectricity may deteriorate.

Preferred embodiments of the present invention provide acoustic wave devices, each of which includes a scandium-containing aluminum nitride film that is unlikely to be warped or peeled off and has characteristics that are unlikely to deteriorate.

An acoustic wave device according to a preferred embodiment of the present invention includes a scandium-containing aluminum nitride film including a first principal surface and a second principal surface opposed to each other, and a first electrode provided on the first principal surface and a second electrode provided on the second principal surface. The scandium-containing aluminum nitride film includes a first electrode vicinity region located at a vicinity of the first electrode, a second electrode vicinity region located at a vicinity of the second electrode, and a central region located between the first electrode vicinity region and the second electrode vicinity region. Assuming that, among a longer diameter and a shorter diameter of a crystal grain in the scandium-containing aluminum nitride film when ellipse approximation is applied to the crystal grain, the shorter diameter is a crystal grain size, and an average value of the crystal grain size in each region is an average grain size $R_{avg}$, the $R_{avg}$ of the first electrode vicinity region is smaller than the $R_{avg}$ of the central region. A fine grain group is included between crystal grains having crystal orientations different from each other in the first electrode vicinity region and on an interface between the first electrode and the scandium-containing aluminum nitride film. Assuming that an area-weighted average value of the crystal grain size in each region is an area-weighted average grain size $R_{Savg}$, a grain size of a crystal grain in the fine grain group is about ½ or smaller of the $R_{Savg}$ of the central region, and a number of crystal grains of the fine grain group in the first electrode vicinity region is about 50% or larger of a total number of crystal grains in the first electrode vicinity region.

According to preferred embodiments of the present invention, acoustic wave devices each include a scandium-containing aluminum nitride film that is unlikely to be warped or peeled off and the characteristics are unlikely to deteriorate.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, the present invention is clarified by description of specific preferred embodiments of the present invention with reference to the drawings.

Note that each preferred embodiment described herein is merely illustrative, and it should be noted that partial replacement or combination of components are possible between different preferred embodiments.

Figure 1A:
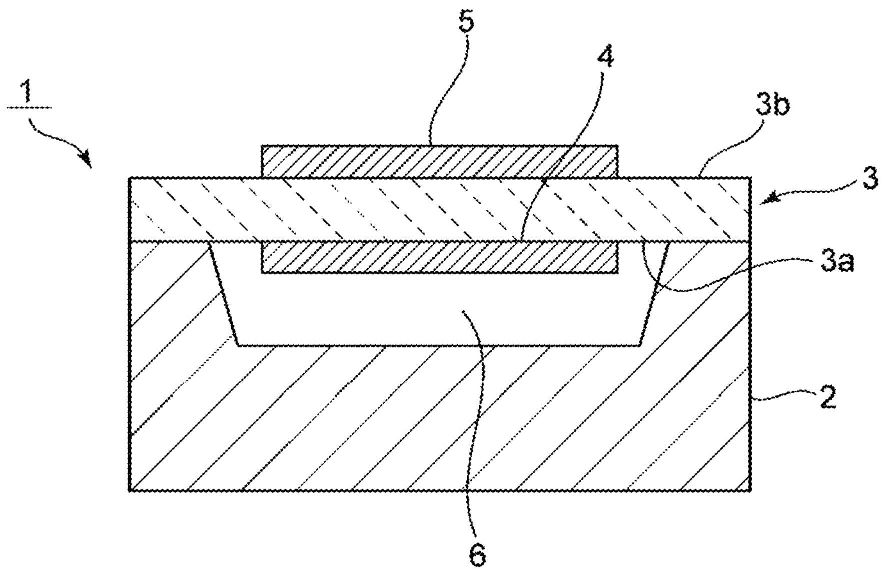
FIGS. 1A and 1B are front sectional views and plan views of an acoustic wave device according to a first preferred embodiment of the present invention.
Figure 1B:
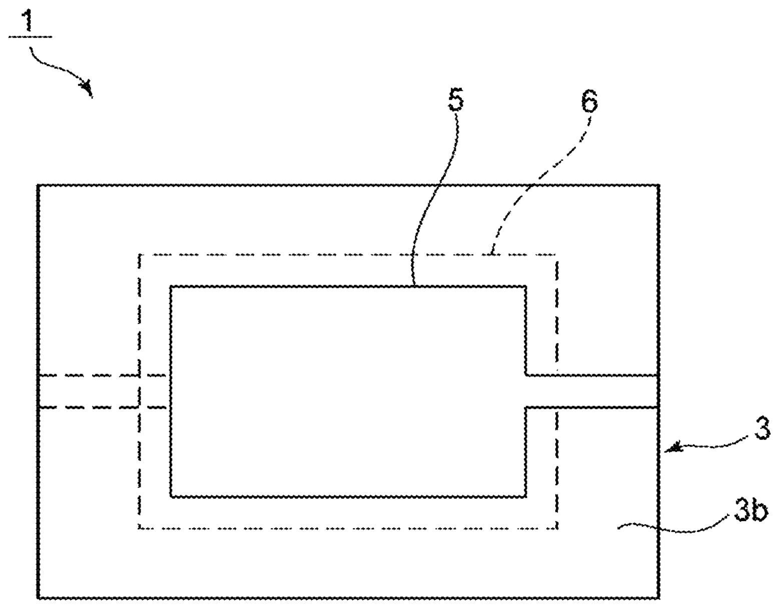

FIG. 1A is a front sectional view of an acoustic wave device according to a first preferred embodiment of the present invention, and FIG. 1B is a plan view thereof.

An acoustic wave device 1 includes a support substrate 2. The support substrate 2 includes an upper surface where a recessed portion is provided. A scandium-containing aluminum nitride film 3 (ScAlN film 3) is disposed to cover the recessed portion on the upper surface of the support substrate 2. The ScAlN film 3 includes a first principal surface 3*a* and a second principal surface 3*b* opposed to the first principal surface 3*a*. The first principal surface 3*a* is disposed on the upper surface of the support substrate 2. Accordingly, a hollow portion 6 is provided.

The acoustic wave device 1 includes first and second excitation electrodes 4 and 5 as first and second electrodes, respectively. The first excitation electrode 4 is provided on the first principal surface 3*a*. The second excitation electrode 5 is provided on the second principal surface 3*b*. In this preferred embodiment, the first excitation electrode 4 and the second excitation electrode 5 are a pair of plate-shaped electrodes. The first excitation electrode 4 and the second excitation electrode 5 are opposed to each other with the ScAlN film 3 interposed therebetween. This opposing region is an excitation region. By applying an alternating-current electric field between the first excitation electrode 4 and the second excitation electrode 5, a bulk acoustic wave (BAW) as an acoustic wave is excited. The acoustic wave device 1 is a BAW device which includes the ScAlN film 3 as a piezoelectric film and in which an acoustic wave which propagates in the ScAlN film 3 is mainly a BAW.

The hollow portion 6 is provided in order not to interfere with the excitation of the BAW in the ScAlN film 3. Therefore, the hollow portion 6 is located at a lower side of the excitation electrode. Note that the upper and lower directions as used herein correspond to upper and lower directions in FIG. 1A. For example, the second principal surface 3*b* of the ScAlN film 3 is located at the upper side of the first principal surface 3*a*.

The first excitation electrode 4 and the second excitation electrode 5 are made of a suitable metal or alloy. Such a material is, for example, a metal such as Ti, Mo, Ru, W, Al, Pt, Ir, Cu, Cr, or Sc, or an alloy using such a metal. Moreover, each of the first and second excitation electrodes 4 and 5 may be a multilayer body including a plurality of metal films.

The support substrate 2 is made of a suitable insulator or semiconductor. Such a material is, for example, silicon, glass, GaAs, a ceramic, quartz crystal, or the like. In this preferred embodiment, the support substrate 2 is a silicon substrate with high resistivity.

Figure 2:
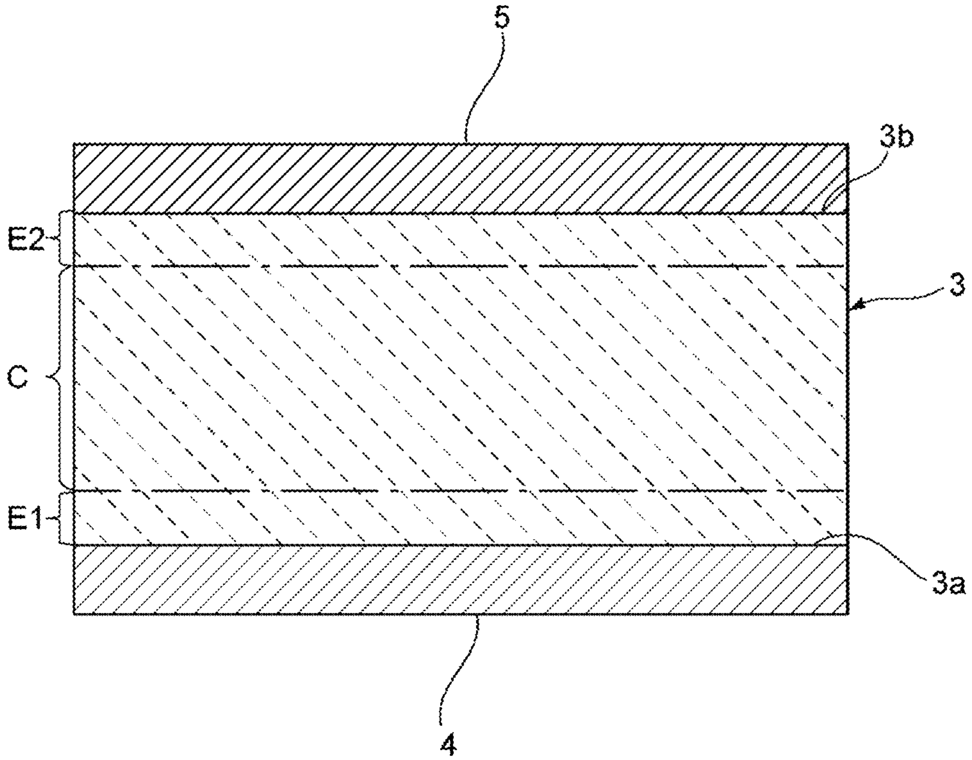
FIG. 2 is a front sectional view illustrating regions of a scandium-containing aluminum nitride film in the first preferred embodiment of the present invention.

FIG. 2 is a front sectional view illustrating regions of a ScAlN film in the first preferred embodiment.

The ScAlN film 3 includes a first electrode vicinity region E1, a central region C, and a second electrode vicinity region E2. The first electrode vicinity region E1 is located at the vicinity of the first excitation electrode 4 as the first electrode. The second electrode vicinity region E2 is located at the vicinity of the second excitation electrode 5 as the second electrode. More specifically, the first electrode vicinity region E1 is a region including the first principal surface 3*a*. The second electrode vicinity region E2 is a region including the second principal surface 3*b*. The thickness of each of the first electrode vicinity region E1 and the second electrode vicinity region E2 may be any thickness within a range of about 5% or larger and about 25% or smaller of a thickness of the ScAlN film 3, for example.

The central region C is located between the first electrode vicinity region E1 and the second electrode vicinity region E2. The first electrode vicinity region E1, the central region C, and the second electrode vicinity region E2 are arranged in the thickness direction. The central region C is an entire region of the electrode except the first electrode vicinity region E1 and the second electrode vicinity region E2 in the thickness direction. Note that, in this preferred embodiment, the first electrode vicinity region E1 and the central region C are regions overlapping with the first electrode in plan view. The plan view is seen from the upper side in FIG. 1A.

The orientation of the ScAlN film can be confirmed by using ASTAR (registered trademark). ASTAR (registered trademark) utilizes an automated crystal orientation mapping-TEM method (ACOM-TEM method).

Figure 3:
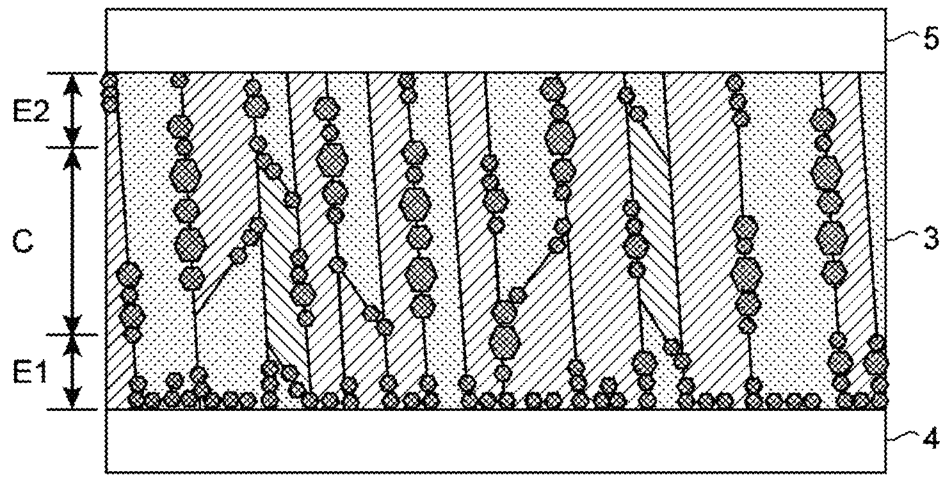
FIG. 3 is a schematic inverse pole figure map indicating an orientation distribution of the scandium-containing aluminum nitride film in the first preferred embodiment of the present invention.

FIG. 3 is a schematic inverse pole figure map indicating an orientation distribution of the ScAlN film in the first preferred embodiment. This schematically illustrates an inverse pole figure map measured by using ASTAR (registered trademark). In FIG. 3, a boundary with a misorientation of about 2° or larger is assumed as a crystal grain boundary. Each crystal grain is represented by a figure whose contour is the grain boundary.

As illustrated in FIG. 3, the ScAlN film 3 of this preferred embodiment further includes a fine grain group between pillar-shaped crystal grains. The fine grain group is included in both the central region C and the first electrode vicinity region E1. Particularly, in the first electrode vicinity region E1, many fine grains are included between the pillar-shaped crystal grains and on an interface between the first excitation electrode 4 and the ScAlN film 3.

Figure 4:
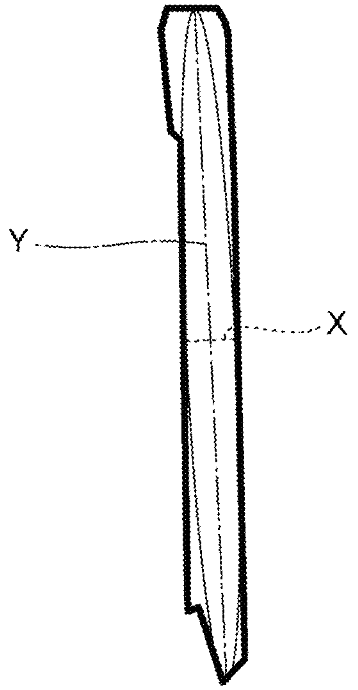
FIG. 4 is a schematic view illustrating a crystal grain size in a preferred embodiment of the present invention.

FIG. 4 is a schematic view illustrating a crystal grain size in a preferred embodiment of the present invention.

In the present invention, the crystal grain size is a dimension indicated by a broken line in FIG. 4. More specifically, among a longer diameter Y and a shorter diameter X when ellipse approximation is applied to the crystal grain in the inverse pole figure map, the crystal grain size is the shorter diameter X. The ellipse approximation may be performed as follows, for example. A plurality of vectors towards the grain boundary are obtained by setting the center of gravity of the crystal grain as the center. Then, the plurality of vectors are weighted based on their magnitudes, and a vector as a weighted average of the plurality of vectors is obtained. A direction of the vector as the weighted average is set as a major-axis direction, and a direction perpendicular to the major-axis direction is set as a minor-axis direction.

Note that the major-axis direction of the ellipse-approximated crystal grain is substantially parallel to a growth direction of the crystal grain. Therefore, the longer diameter Y of the crystal grain is likely to depend on the thickness of the ScAlN film 3. Thus, preferred embodiments of the present invention focus on the shorter diameter X, and the shorter diameter X is assumed as the crystal grain size.

Here, in each region, an average value of the crystal grain sizes is assumed as an average grain size $R_{avg}$. The $R_{avg}$ in the first electrode vicinity region E1 is assumed as $R_{avg\_E1}$, and the $R_{avg}$ in the central region C is assumed as $R_{avg\_C}$. Meanwhile, in each region, an area-weighted average value of the crystal grain sizes is assumed as an area-weighted average grain size $R_{Savg}$. The $R_{Savg}$ in the first electrode vicinity region E1 is assumed as $R_{Savg\_E1}$, and the $R_{Savg}$ in the central region C is assumed as $R_{Savg\_C}$. When the area-weighted average value of the crystal grain sizes is calculated, the grain size of each crystal grain may be weighted based on an area of the crystal grain indicated in the inverse pole figure map. Specifically, the $R_{Savg}$ may be calculated by dividing a sum of products of the sizes and areas of the crystal grains by a sum of the areas of the crystal grains.

One of the unique features of this preferred embodiment is to have the following configurations. 1) The average grain size $R_{avg\_E1}$ of the first electrode vicinity region E1 is smaller than the average grain size $R_{avg\_C}$ of the central region C. 2) The fine grain group is included between the crystal grains in the first electrode vicinity region E1 and on the interface between the first excitation electrode 4 and the ScAlN film 3, and the grain size of the crystal grains of the fine grain group is about ½ or smaller of the area-weighted average grain size $R_{Savg\_C}$ of the central region C. 3) The number of crystal grains of the fine grain group in the first electrode vicinity region E1 is about 50% or larger of the total number of crystal grains in the first electrode vicinity region E1. Since the acoustic wave device 1 has the configurations described in 1) to 3), the ScAlN film 3 is unlikely to be warped or peeled off, and thus the characteristics are unlikely to deteriorate. This will be described below together with a specific crystal configuration of the ScAlN film 3 in this preferred embodiment.

Figure 5:
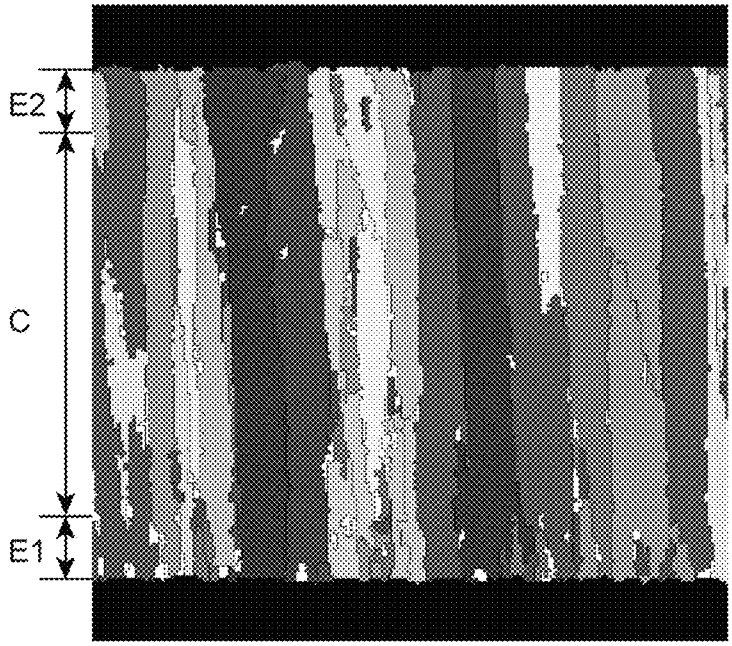
FIG. 5 is an inverse pole figure map indicating the orientation distribution of the scandium-containing aluminum nitride film in the first preferred embodiment of the present invention, the orientation distribution being measured using ASTAR (registered trademark).

FIG. 5 is an inverse pole figure map indicating the orientation distribution of the ScAlN film in the first preferred embodiment, the orientation distribution being measured using ASTAR (registered trademark). In FIG. 5, a boundary with a misorientation of 2° or larger is assumed as a crystal grain boundary. In FIG. 5, white domains indicate the crystal grains of the fine grain group.

Figure 6:
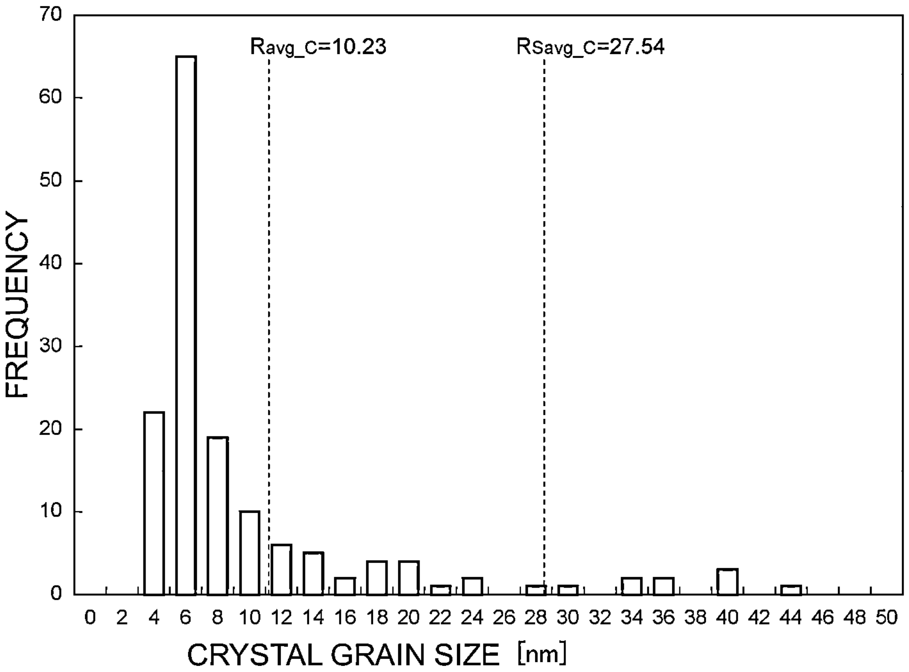
FIG. 6 is a graph illustrating a frequency distribution of the crystal grain sizes in a central region of the ScAlN film in the first preferred embodiment of the present invention.
Figure 7:
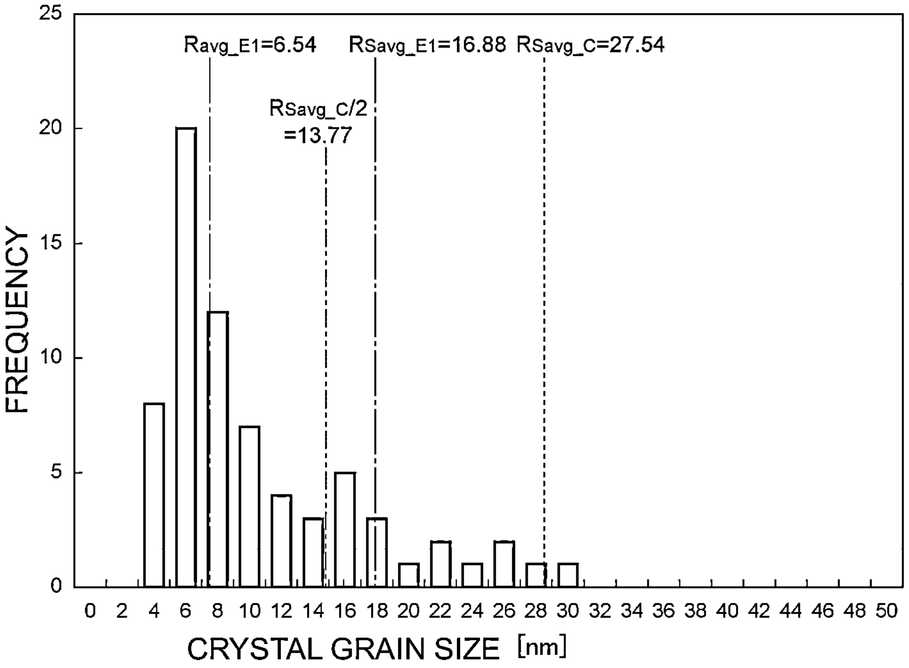
FIG. 7 is a graph illustrating a frequency distribution of the crystal grain sizes in a first electrode vicinity region of the ScAlN film in the first preferred embodiment of the present invention.

The ScAlN film 3 illustrated in FIG. 5 has a Sc concentration of about 6.8 atm % and a thickness of about 640 nm, for example. A result of the grain size analysis using FIG. 5 is illustrated in FIG. 6 and FIG. 7. Note that, in the grain size analysis, the thickness of each of the first electrode vicinity region E1 and the second electrode vicinity region E2 is about 80 nm, and the thickness of the central region C is about 480 nm, for example. That is, the thickness of each of the first electrode vicinity region E1 and the second electrode vicinity region E2 is about 12.5% of the thickness of the ScAlN film 3, for example.

FIG. 6 is a graph illustrating a frequency distribution of the crystal grain sizes in the central region of the ScAlN film in the first preferred embodiment. FIG. 7 is a graph illustrating a frequency distribution of the crystal grain sizes in the first electrode vicinity region of the ScAlN film in the first preferred embodiment. In FIG. 6 and FIG. 7, a horizontal axis indicative of classes also schematically indicates the average grain size and the like.

As indicated by each broken line in FIG. 6, in the central region C of the ScAlN film 3, the average grain size $R_{avg\_C}$ is about 10.23 nm, and the area-weighted average grain size $R_{Savg\_C}$ is about 27.54 nm, for example. As indicated by each one-dot chain line in FIG. 7, in the first electrode vicinity region E1, the average grain size $R_{avg\_E1}$ is about 6.54 nm, and the area-weighted average grain size $R_{Savg\_E1}$ is about 16.88 nm, for example. As described above, $R_{avg\_E1}<R_{avg\_C}$ can be seen based on the comparison of the average grain sizes $R_{avg}$ in both regions.

A two-dot chain line in FIG. 7 indicates about 13.77 nm, which is about ½ of the area-weighted average grain size $R_{Savg\_C}$ of the central region C, for example. That is, the grain size of the crystal grains of the fine grain group in this preferred embodiment is about 13.77 nm or smaller, for example. Moreover, in this preferred embodiment, the number of crystal grains of the fine grain group in the first electrode vicinity region E1 is about 50% or larger of the total number of crystal grains in the first electrode vicinity region E1.

When the acoustic wave device 1 is manufactured, the ScAlN film 3 is formed on the first excitation electrode 4. Therefore, a configuration of the first electrode vicinity region E1 is important for growth of the crystal grain in the deposition of the ScAlN film 3.

During the deposition of the ScAlN film, the crystal grains grow while competing against each other. Therefore, stress is applied between the crystal grains. Moreover, lattice mismatching in the electrode and the ScAlN film causes strain. This strain also add stress between the crystal grains. Therefore, as described above, the ScAlN film is easily warped or peeled off.

With this respect, in this preferred embodiment, $R_{avg\_E1}<R_{avg\_C}$ is satisfied. Since the crystal grain size in the first electrode vicinity region E1 is small, the bias of the crystal orientation in the first electrode vicinity region E1 is small. Moreover, AlN has anisotropy regarding an elastic modulus and a piezoelectric constant. Therefore, the stress attributed to the strain due to the lattice mismatching can be distributed. Furthermore, many fine grains are included between the crystal grains in the first electrode vicinity region E1 and on the interface of the first excitation electrode 4 and the ScAlN film 3. Specifically, the number of crystal grains of the fine grain group in the first electrode vicinity region E1 is about 50% or larger of the total number of crystal grains in the first electrode vicinity region E1, for example. Therefore, the stress between the crystal grains can be distributed. Thus, the ScAlN film 3 is unlikely to be warped or peeled off, and the characteristics are unlikely to deteriorate. In addition, since defects in the crystal included in the ScAlN film 3 can be reduced, piezoelectricity can be improved.

Note that, in FIG. 3 and FIG. 5, the boundary with a misorientation of about 2° or larger, for example, is assumed as the crystal grain boundary. However, the reference misorientation of the crystal grain boundary is not limited to about 2°. It has been found that a similar effect of various preferred embodiments of the present invention can also be achieved in a case where a boundary with a misorientation of about 3° or larger, about 4° or larger, or about 5° or larger, for example, is assumed as the crystal grain boundary.

Meanwhile, the ScAlN film 3 can be formed by a suitable method such as sputtering or CVD. In this preferred embodiment, deposition of the ScAlN film 3 is performed by using an RF magnetron sputtering apparatus.

Regarding the sputtering, the sputtering is performed in a nitrogen gas atmosphere using a first target made of Al and a second target made of Sc. That is, the ScAlN film is formed by a binary sputtering method. In this case, the degree of orientation of the ScAlN film and the proportion of the fine grain group can be controlled through adjustment of sputtering conditions. The sputtering conditions include, for example, a magnitude of RF power, a gas pressure, a flow rate of gas, a composition or purity of a target material, and the like.

Preferred configurations of this preferred embodiment are described below.

A ratio of the area-weighted average grain size of the central region C to the average grain size of each region ($R_{Savg\_C}/R_{avg}$) is assumed as a ratio F. The ratio F is an index of a magnitude of the effect of the fine grain group in each region in a case where the area-weighted average grain size $R_{Savg\_C}$ of the central region C is used as a reference. More specifically, in a region where the ratio F is larger, the average grain size $R_{avg}$ with respect to the area-weighted average grain size $R_{Savg\_C}$ in the central region C is smaller. The average grain size $R_{avg}$ is smaller because the influence of the fine grain group on the average grain size $R_{avg}$ is larger. Therefore, in a region where the ratio F is large, many crystal grains of the fine grain group exist.

Assume that the ratio F in the first electrode vicinity region E1 is $F_{E1}=R_{Savg\_C}/R_{avg\_E1}$, and the ratio F in the central region C is $F_C=R_{Savg\_C}/R_{avg\_C}$. In an example of this preferred embodiment, $F_{E1}=27.54/6.54=4.21$ and $F_C=27.54/10.23=2.69$, for example, are satisfied.

This result is summarized in Table 1.

TABLE 1

| | Average grain size $R_{avg}$[nm] | Area-weighted average grain size $R_{Savg}$[nm] | F ($R_{Savg\_C}/R_{avg}$) |
|---|---|---|---|
| Central region | $R_{avg\_C}$ = 10.23 | $R_{Savg\_C}$ = 27.54 | $F_C$ = 2.69 |
| First electrode vicinity region | $R_{avg\_E1}$ = 6.54 | $R_{Savg\_E1}$ = 16.88 | $F_{E1}$ = 4.21 |
| First electrode vicinity region/ central region | | | $F_{E1}/F_C$ = 1.56 |

As described above, preferably, $F_{E1}>F_C$ is satisfied, and more preferably, $F_{E1}>$about $1.5\times F_C$ is satisfied. In this case, many crystal grains of the fine grain group exist in the first electrode vicinity region E1, and thus, the stress between the crystal grains can effectively be distributed. Thus, a warp and peeling off of the ScAlN film 3 can effectively be reduced or prevented.

Moreover, in the frequency distributions of the crystal grain sizes having a class interval of about 2 nm as illustrated in FIG. 6 and FIG. 7, an integral of frequencies of the crystal grain sizes within a range of about ±40% of the average value of the crystal grain sizes is assumed as an integrated frequency A. Specifically, in the frequency distribution of the crystal grain sizes having the class interval of 2 nm in each region, the integrated frequency A obtained by integrating frequencies of the crystal grain sizes within a range of $R_{avg}$±about 40% is assumed as $A_{avg}$, and the integrated frequency A obtained by integrating frequencies of the crystal grain sizes within a range of $R_{Savg}$±about 40% is assumed as $A_{Savg}$, for example.

More specifically, in the frequency distribution of the crystal grain sizes having the class interval of about 2 nm in the central region C, the integrated frequency A obtained by integrating frequencies of the crystal grain sizes within a range of $R_{avg\_C}$±about 40% is assumed as $A_{avg\_C}$, and the integrated frequency A obtained by integrating frequencies of the crystal grain sizes within a range of $R_{Savg\_C}$±about 40% is assumed as $A_{Savg\_C}$, for example. In the frequency distribution of the crystal grain sizes having the class interval of about 2 nm in the first electrode vicinity region E1, the integrated frequency A obtained by integrating frequencies of the crystal grain sizes within a range of $R_{avg\_E1}$±about 40% is assumed as $A_{avg\_E1}$, and the integrated frequency A obtained by integrating frequencies of the crystal grain sizes within a range of $R_{Savg\_E1}$±about 40% is assumed as $A_{Savg\_E1}$, for example. Here, similarly to the ratio F described above, in the frequency distribution of the crystal grain sizes having the class interval of about 2 nm in the first electrode vicinity region E1, as an index using the area-weighted average grain size $R_{Savg\_C}$ of the central region C as a reference, the integrated frequency A obtained by integrating frequencies of the crystal grain sizes within the range of $R_{Savg\_C}$±about 40% is assumed as $A_{Savg\_E1\text{-}C}$, for example.

A ratio of the $A_{avg}$ in each region to the integrated frequency $A_{Savg}$ on the basis of the area-weighted average grain size $R_{Savg\_C}$ of the central region C is assumed as a ratio G. Specifically, the integrated frequency $A_{Savg}$ on the basis of the area-weighted average grain size $R_{Savg\_C}$ of the central region C is the integrated frequency $A_{Savg\_E1\text{-}C}$ and the integrated frequency $A_{Savg\_C}$. The ratio G is an index of the magnitude of the effect of the fine grain group in each region in a case where the integrated frequency $A_{Savg}$ as described above is used as a reference.

More specifically, when many crystal grains of fine grain group exist, the average grain size $R_{avg}$ is smaller. Therefore, the grain sizes of the crystal grains of the fine grain group are likely to be distributed within the range of $R_{avg}$±about 40%, for example. As described above, since many crystal grains of the fine grain group exist, the integrated frequency $A_{avg}$ further increases when the frequencies of the grain sizes of those crystal grains are included in the integrated frequency $A_{avg}$. Thus, it can be said that the influence of the fine grain group is large when the integrated frequency $A_{avg}$ is large. Moreover, in a region where the integrated frequency $A_{avg}$ is large with respect to the integrated frequency $A_{Savg}$ on the basis of the area-weighted average grain size $R_{Savg\_C}$ of the central region C, the ratio G is large. Therefore, in a region where the ratio G is large, many crystal grains of the fine grain group exist.

Assume that the ratio G in the first electrode vicinity region E1 is $G_{E1}=A_{avg\_E1}/A_{Savg\_E1\text{-}C}$, and the ratio G in the central region C is $G_C=A_{avg\_C}/A_{Savg\_C}$. In an example of this preferred embodiment, $G_{E1}=47/16=2.94$ and $G_C=62/22=2.82$ are satisfied, for example. This result is summarized in Table 2.

TABLE 2

| | Integrated frequency A (within range of average grain size ± 40%) | Integrated frequency A (within range of area-weighted average grain size ± 40%) | G |
|---|---|---|---|
| Central region | $A_{avg\_C}$ = 62 | $A_{Savg\_C}$ = 22 | $G_C$ = 2.82 |
| First electrode vicinity region (use $R_{Savg\_C}$ as $R_{Savg}$) | $A_{avg\_E1}$ = 47 | $A_{Savg\_E1\text{-}C}$ = 16 | $G_{E1}$ = 2.94 |
| First electrode vicinity region/ central region | | | $G_{E1}/G_C$ = 1.04 |

As described above, preferably, $G_{E1}>G_C$ is satisfied, and more preferably, $G_{E1}>$about $1.04\times G_C$ is satisfied. In this case, many crystal grains of the fine grain group exist in the first electrode vicinity region E1, and thus, the stress between the crystal grains can effectively be distributed. Thus, a warp and peeling off of the ScAlN film 3 can effectively be reduced or prevented.

Moreover, in the frequency distributions of the crystal grain sizes having the class interval of about 2 nm as illustrated in FIG. 6 and FIG. 7, an average value of the frequencies of the crystal grain sizes within a range of ±about 2 nm of the average value of the crystal grain sizes is assumed as an average frequency B, for example. Specifically, in the frequency distribution of the crystal grain sizes having the class interval of about 2 nm in each region, the average frequency B as an average value of frequencies of the crystal grain sizes within a range of $R_{avg}$±about 2 nm is assumed as $B_{avg}$, and the average frequency B as an average value of frequencies of the crystal grain sizes within a range of $R_{Savg}$±about 2 nm is assumed as $B_{Savg}$, for example.

More specifically, in the frequency distribution of the crystal grain sizes having the class interval of about 2 nm in the central region C, the average frequency B as an average value of frequencies of the crystal grain sizes within a range of $R_{avg\_C}$±about 2 nm is assumed as $B_{avg\_C}$, and the average frequency B as an average value of frequencies of the crystal grain sizes within a range of $R_{Savg\_C}$±about 2 nm is assumed as $B_{Savg\_C}$, for example. In the frequency distribution of the crystal grain sizes having the class interval of about 2 nm in the first electrode vicinity region E1, the average frequency B as an average value of frequencies of the crystal grain sizes within a range of $R_{avg\_E1}$±about 2 nm is assumed as $B_{avg\_E1}$, and the average frequency B as an average value of frequencies of the crystal grain sizes within a range of $R_{Savg\_E1}$±about 2 nm is assumed as $B_{Savg\_E1}$, for example. Here, similarly to the ratio F described above, in the frequency distribution of the crystal grain sizes having the class interval of about 2 nm in the first electrode vicinity region E1, as an index using the area-weighted average grain size $R_{Savg\_C}$ of the central region C as a reference, the average frequency B as an average value of frequencies of the crystal grain sizes within the range of $R_{Savg\_C}$±about 2 nm is assumed as $B_{Savg\_E1\text{-}C}$, for example.

A ratio of the $B_{avg}$ in each region to the average frequency $B_{Savg}$ on the basis of the area-weighted average grain size $R_{Savg\_C}$ of the central region C is assumed as a ratio H. Specifically, the average frequency $B_{Savg}$ on the basis of the area-weighted average grain size $R_{Savg\_C}$ of the central region C is the average frequency $B_{Savg\_E1\text{-}C}$ and the average frequency $B_{Savg\_C}$. The ratio H is an index of the magnitude of the effect of the fine grain group in each region in a case where the average frequency $B_{Savg}$ as described above is used as a reference. Similarly to the case where the ratio G is large, when the ratio H is large, many crystal grains of the fine grain group exist.

Assume that the ratio H in the first electrode vicinity region E1 is $H_{E1}=B_{avg\_E1}/B_{Savg\_E1\text{-}C}$, and the ratio H in the central region C is $H_C=B_{avg\_C}/B_{Savg\_C}$. In an example of this preferred embodiment, $H_{E1}$=13.33/1.33=10.02 and $H_C$=6.33/1=6.33 are satisfied. This result is summarized in Table 3.

TABLE 3

| | Average frequency B (within range of average grain size ± 2 nm) | Average frequency B (within range of area-weighted average grain size ± 2 nm) | H |
|---|---|---|---|
| Central region | $B_{avg\_C}$ = 6.33 | $B_{Savg\_C}$ = 1 | $H_C$ = 6.33 |
| First electrode vicinity region (use $R_{Savg\_C}$ as $R_{Savg}$) | $B_{avg\_E1}$ = 13.33 | $B_{Savg\_E1\text{-}C}$ = 1.33 | $H_{E1}$ = 10.02 |
| First electrode vicinity region/ central region | | | $H_{E1}/H_C$ = 1.58 |

As described above, preferably, $H_{E1}$>$H_C$ is satisfied, and more preferably, $H_{E1}$>about 1.5×$H_C$ is satisfied. In this case, many crystal grains of the fine grain group exist in the first electrode vicinity region E1, and thus, the stress between the crystal grains can effectively be distributed. Thus, a warp and peeling off of the ScAlN film 3 can effectively be reduced or prevented.

The results described above are summarized in Table 4 to Table 6.

TABLE 4

| | Average grain size $R_{avg}$[nm] | Integrated frequency A (within range of ± 40%) | Average frequency B (within range of ± 2 nm) |
|---|---|---|---|
| Central region | $R_{avg\_C}$ = 10.23 | $A_{avg\_C}$ = 62 | $B_{avg\_C}$ = 6.33 |
| First electrode vicinity region | $R_{avg\_E1}$ = 6.54 | $A_{avg\_E1}$ = 47 | $B_{avg\_E1}$ = 13.33 |

TABLE 5

| | Area-weighted average grain size $R_{Savg}$[nm] | Integrated frequency A (within range of ± 40%) | Average frequency B (within range of ± 2 nm) |
|---|---|---|---|
| Central region | $R_{Savg\_C}$ = 27.54 | $A_{Savg\_C}$ = 22 | $B_{Savg\_C}$ = 1 |
| First electrode vicinity region (use $R_{Savg\_C}$ as $R_{Savg}$) | $R_{Savg\_C}$ = 27.54 | $A_{Savg\_E1\text{-}C}$ = 16 | $B_{Savg\_E1\text{-}C}$ = 1.33 |
| First electrode vicinity region | $R_{Savg\_E1}$ = 16.88 | $A_{Savg\_E1}$ = 26 | $B_{Savg\_E1}$ = 3.67 |

TABLE 6

| | F ($R_{Savg\_C}/R_{avg}$) | G (Integrated frequency A) | H (Average frequency B) |
|---|---|---|---|
| Central region | $F_C$ = 2.69 | $G_C$ = 2.82 | $H_C$ = 6.33 |
| First electrode vicinity region | $F_{E1}$ = 4.21 | $G_{E1}$ = 2.94 | $H_{E1}$ = 10.02 |
| First electrode vicinity region/ central region | $F_{E1}/F_C$ = 1.56 | $G_{E1}/G_C$ = 1.04 | $H_{E1}/H_C$ = 1.58 |

Figure 8:
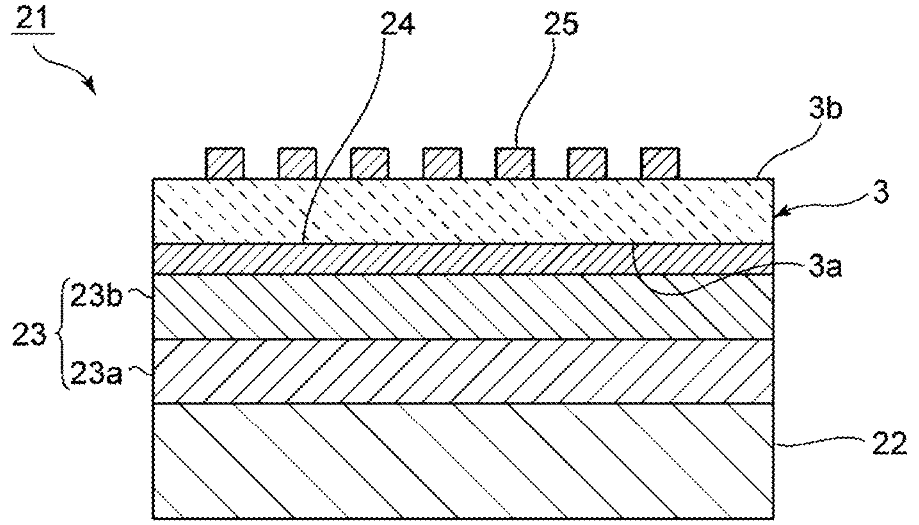
FIG. 8 is a front sectional view of an acoustic wave device according to a second preferred embodiment of the present invention.

FIG. 8 is a front sectional view of an acoustic wave device according to a second preferred embodiment.

Also in this preferred embodiment, a ScAlN film 3 similar to that of the first preferred embodiment is used. Note that although the first electrode is a plate-shaped electrode 24 similar to that of the first preferred embodiment, the first electrode is not used as an excitation electrode. The second electrode is an IDT electrode 25. By applying an alternating-current electric field to the IDT electrode 25, a plate wave is excited. An acoustic wave device 21 is a surface acoustic wave device. Note that, although not illustrated, a pair of reflectors are provided on the second principal surface 3*b* on both sides of the IDT electrode 25 in a propagation direction of an acoustic wave.

In the acoustic wave device 21, the ScAlN film 3 is disposed above a support substrate 22 with an intermediate layer 23 interposed therebetween. The intermediate layer 23 has a structure in which a second dielectric layer 23*b* is disposed on a first dielectric layer 23*a*. In this preferred embodiment, the first dielectric layer 23*a* is made of silicon nitride. The second dielectric layer 23*b* is made of silicon oxide.

In this preferred embodiment, the plate-shaped electrode 24 and the IDT electrode 25 are opposed to each other with the ScAlN film 3 interposed therebetween. Therefore, an element capacitance can be made large. Thus, downsizing of the acoustic wave device 21 can be facilitated.

Note that, as the material of the IDT electrode 25, a material similar to that of the second excitation electrode 5 described above may be used.

Moreover, as the materials of the first dielectric layer 23*a* and the second dielectric layer 23*b* of the intermediate layer 23, besides silicon nitride and silicon oxide, various dielectric materials such as alumina and silicon oxynitride may be used.

The support substrate 22 may be made of a material similar to that of the support substrate 2 in the first preferred embodiment. Note that the support substrate 22 is not provided with a recessed portion.

Also in this preferred embodiment, the ScAlN film 3 and the first electrode are configured similarly to the first preferred embodiment. Therefore, also in the acoustic wave device 21, the ScAlN film 3 is unlikely to be warped or peeled off, and the characteristics are unlikely to deteriorate.

Figure 9:
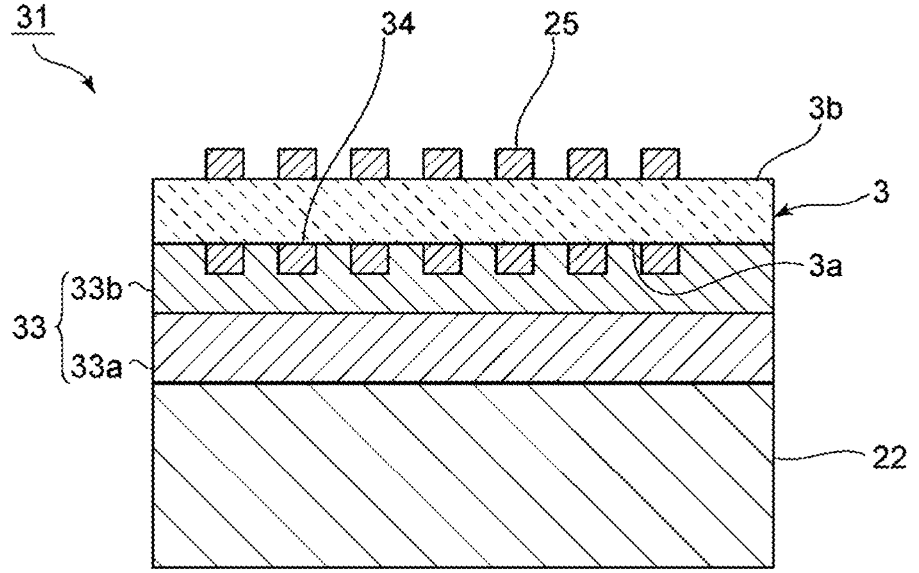
FIG. 9 is a front sectional view of an acoustic wave device according to a third preferred embodiment of the present invention.

FIG. 9 is a front sectional view of an acoustic wave device according to a third preferred embodiment of the present invention.

This preferred embodiment is different from the second preferred embodiment in that an intermediate layer 33 includes a high acoustic velocity film 33*a* as a high acoustic velocity material layer and a low acoustic velocity film 33*b*, and that the first electrode is an IDT electrode 34. Except for the points described above, an acoustic wave device 31 of this preferred embodiment has a configuration similar to that of the acoustic wave device 21 of the second preferred embodiment.

The IDT electrode 34 is embedded in the intermediate layer 33. The IDT electrode 34 and the IDT electrode 25 are opposed to each other with the ScAlN film 3 interposed therebetween. When seen in plan view, the centers of the electrode fingers of the IDT electrode 34 in the acoustic wave propagation direction and the centers of the electrode fingers of the IDT electrode 25 in the acoustic wave propagation direction overlap with each other. However, the positional relation between the electrode fingers of the IDT electrode 34 and the electrode fingers of the IDT electrode 25 is not limited to the above.

The high acoustic velocity material layer is a layer in which an acoustic velocity is relatively high. More specifically, an acoustic velocity of a bulk wave which propagates in the high acoustic velocity material layer is higher than an acoustic velocity of an acoustic wave which propagates in the ScAlN film 3. As described above, in this preferred embodiment, the high acoustic velocity material layer is the high acoustic velocity film 33*a*. The material of the high acoustic velocity material layer is, for example, aluminum oxide, silicon carbide, silicon nitride, silicon oxynitride, silicon, sapphire, lithium tantalate, lithium niobate, quartz crystal, alumina, zirconia, cordierite, mullite, steatite, forsterite, magnesia, diamond-like carbon (DLC) film, or diamond, a medium whose major component is any of the above materials, a medium whose major component is a mixture of any of the above materials, or the like.

The low acoustic velocity film 33*b* is a film in which an acoustic velocity is relatively low. More specifically, an acoustic velocity of a bulk wave which propagates in the low acoustic velocity film 33*b* is lower than an acoustic velocity of a bulk wave which propagates in the ScAlN film 3. The material of the low acoustic velocity film is, for example, silicon oxide, glass, silicon oxynitride, tantalum oxide, a compound in which fluorine, carbon, boron, hydrogen, or a silanol group is added to silicon oxide, a medium whose major component is any of the above materials, or the like.

The high acoustic velocity film 33*a* as the high acoustic velocity material layer, the low acoustic velocity film 33*b*, and the ScAlN film 3 are stacked in this order. Thus, the energy of an acoustic wave can effectively be confined on the ScAlN film 3 side.

Moreover, also in this preferred embodiment, the ScAlN film 3 is configured similarly to the second preferred embodiment, and the first electrode is provided on the ScAlN film 3. Therefore, also in this preferred embodiment, the ScAlN film 3 is unlikely to be warped or peeled off, and the characteristics are unlikely to deteriorate.

Note that the intermediate layer may be the low acoustic velocity film 33*b*. In this case, the support substrate 22 is preferably a high acoustic velocity support substrate as the high acoustic velocity material layer. The high acoustic velocity support substrate as the high acoustic velocity material layer, the low acoustic velocity film 33*b*, and the ScAlN film 3 are stacked in this order. Thus, the energy of an acoustic wave can effectively be confined on the ScAlN film 3 side.

The intermediate layer may be the high acoustic velocity film 33*a*. The high acoustic velocity film 33*a* as the high acoustic velocity material layer and the ScAlN film 3 are stacked. Thus, the energy of an acoustic wave can effectively be confined on the ScAlN film 3 side.

Also in the case where the intermediate layer is not provided, the support substrate 22 is preferably a high acoustic velocity support substrate. The high acoustic velocity support substrate and the ScAlN film 3 are stacked. Thus, the energy of an acoustic wave can effectively be confined on the ScAlN film 3 side.

Figure 10:
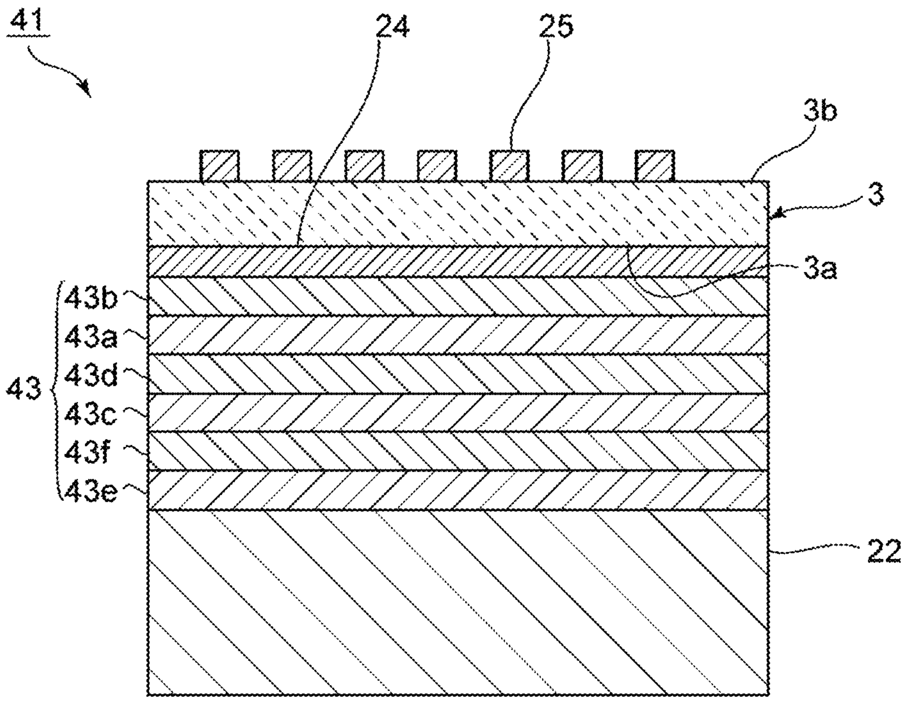
FIG. 10 is a front sectional view of an acoustic wave device according to a fourth preferred embodiment of the present invention.

FIG. 10 is a front sectional view of an acoustic wave device according to a fourth preferred embodiment of the present invention.

In an acoustic wave device 41, an intermediate layer 43 includes an acoustic reflection layer. That is, the intermediate layer 43 is a multilayer body including high acoustic impedance layers 43*a*, 43*c*, and 43*e* which are relatively high, and low acoustic impedance layers 43*b*, 43*d*, and 43*f* having relatively low acoustic impedance. Except for the configuration of the intermediate layer 43 as described above, the acoustic wave device 41 is configured similarly to the acoustic wave device 21.

In a preferred embodiment of the present invention, such an acoustic reflection layer may be used as the intermediate layer. Also in the acoustic wave device 41, the ScAlN film 3 and the first electrode are configured similarly to the second preferred embodiment. Therefore, the film is unlikely to be warped or peeled off, and the characteristics are unlikely to deteriorate.

Note that, as the material of the high acoustic impedance layer, for example, a metal such as platinum or tungsten or a dielectric such as aluminum nitride or silicon nitride may be used. As the material of the low acoustic impedance layer, for example, silicon oxide, aluminum, or the like may be used. Since the acoustic reflection layer is provided, the energy of an acoustic wave can effectively be confined on the ScAlN film 3 side.

Figure 11:
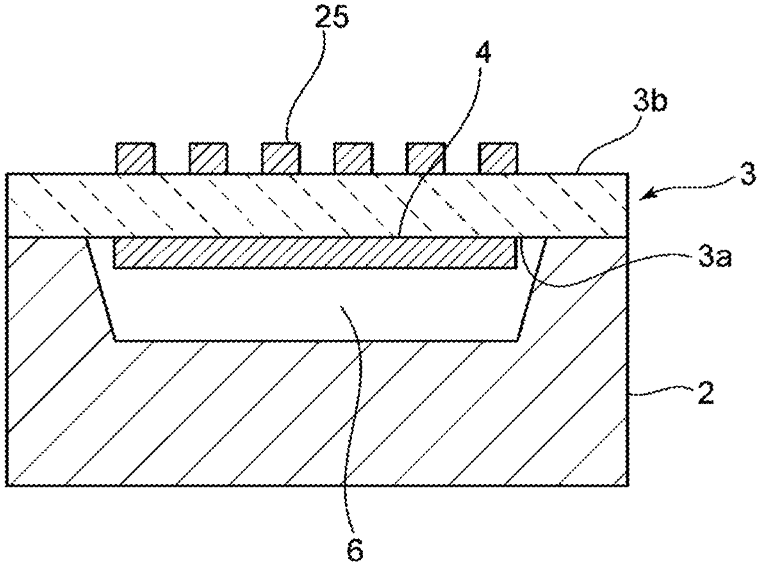
FIG. 11 is a front sectional view of an acoustic wave device according to a fifth preferred embodiment of the present invention.

FIG. 11 is a front sectional view of an acoustic wave device according to a fifth preferred embodiment of the present invention.

This preferred embodiment is different from the first preferred embodiment in that the second electrode is the IDT electrode 25. Note that the IDT electrode 25 is provided on the second principal surface 3*b* of the ScAlN film 3. Except for the points described above, the acoustic wave device of this preferred embodiment has a configuration similar to that of the acoustic wave device 1 of the first preferred embodiment.

It is sufficient that, when seen in plan view, at least a portion of the IDT electrode 25 overlap with the hollow portion 6.

The acoustic wave device of this preferred embodiment is a surface acoustic wave device which includes the ScAlN film 3 as a piezoelectric film and where an acoustic wave which propagates in the ScAlN film 3 is mainly a plate wave. Also in this preferred embodiment, the ScAlN film 3 is configured similarly to the first preferred embodiment, and the first electrode is provided on the ScAlN film 3. Therefore, the film is unlikely to be warped or peeled off, and piezoelectricity is unlikely to deteriorate.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:

a scandium-containing aluminum nitride film including a first principal surface and a second principal surface opposed to each other; and a first electrode on the first principal surface and a second electrode on the second principal surface; wherein the scandium-containing aluminum nitride film includes a first electrode vicinity region located at a vicinity of the first electrode, a second electrode vicinity region located at a vicinity of the second electrode, and a central region located between the first electrode vicinity region and the second electrode vicinity region;

assuming that, among a longer diameter and a shorter diameter of a crystal grain in the scandium-containing aluminum nitride film when ellipse approximation is applied to the crystal grain, the shorter diameter is a crystal grain size, and an average value of the crystal grain size in each region is an average grain size $R_{avg}$, the $R_{avg}$ of the first electrode vicinity region is smaller than the $R_{avg}$ of the central region; and a fine grain group is included between crystal grains with crystal orientations different from each other in the first electrode vicinity region and on an interface between the first electrode and the scandium-containing aluminum nitride film, and assuming that an area-weighted average value of the crystal grain size in each region is an area-weighted average grain size $R_{Savg}$, a grain size of a crystal grain in the fine grain group is about ½ or smaller of the $R_{Savg}$ of the central region, and a number of crystal grains of the fine grain group in the first electrode vicinity region is about 50% or larger of a total number of crystal grains in the first electrode vicinity region.

2. The acoustic wave device according to claim 1, wherein, in the scandium-containing aluminum nitride film, assuming that the $R_{avg}$ of the central region is $R_{avg\_C}$, the $R_{avg}$ of the first electrode vicinity region is $R_{avg\_E1}$, the $R_{Savg}$ of the central region is $R_{Savg\_C}$, and $F_{E1}=R_{Savg\_C}/R_{avg\_E1}$ and $F_C=R_{Savg\_C}/R_{avg\_C}$ are satisfied, $F_{E1}>F_C$ is satisfied.

3. The acoustic wave device according to claim 2, wherein $F_{E1}>1.5\times F_C$ is satisfied.

4. The acoustic wave device according to claim 1, wherein, in the scandium-containing aluminum nitride film, assuming that the $R_{avg}$ of the central region is $R_{avg\_C}$, the $R_{avg}$ of the first electrode vicinity region is $R_{avg\_E1}$, the $R_{Savg}$ of the central region is $R_{Savg\_C}$, in a frequency distribution of the crystal grain size having a class interval of about 2 nm in the central region, an integrated frequency A obtained by integrating a frequency of the crystal grain size within a range of $R_{avg\_C}$±about 40% is $A_{avg\_C}$, and an integrated frequency A obtained by integrating a frequency of the crystal grain size within a range of $R_{Savg\_C}$±about 40% is $A_{Savg\_C}$, in a frequency distribution of the crystal grain size having a class interval of about 2 nm in the first electrode vicinity region, an integrated frequency A obtained by integrating a frequency of the crystal grain size within a range of $R_{avg\_E1}$±about 40% is $A_{avg\_E1}$, and an integrated frequency A obtained by integrating a frequency of the crystal grain size within the range of $R_{Savg\_C}$±about 40% is $A_{Savg\_E1\text{-}C}$, and $G_{E1}=A_{avg\_E1}/A_{Savg\_E1\text{-}C}$ and $G_C=A_{avg\_C}/A_{Savg\_C}$ are satisfied, $G_{E1}>G_C$ is satisfied.

5. The acoustic wave device according to claim 4, wherein $G_{E1}\geq$about $1.04\times G_C$ is satisfied.

6. The acoustic wave device according to claim 1, wherein, in the scandium-containing aluminum nitride film, assuming that the $R_{avg}$ of the central region is $R_{avg\_C}$, the $R_{avg}$ of the first electrode vicinity region is $R_{avg\_E1}$, the $R_{Savg}$ of the central region is $R_{Savg\_C}$, in a frequency distribution of the crystal grain size having a class interval of about 2 nm in the central region, an average frequency B as an average value of a frequency of the crystal grain size within a range of $R_{avg\_C}$±about 2 nm is $B_{avg\_C}$, and an average frequency B as an average value of a frequency of the crystal grain size within a range of $R_{Savg\_C}$±about 2 nm is $B_{Savg\_C}$, in a frequency distribution of the crystal grain size having a class interval of about 2 nm in the first electrode vicinity region, an average frequency B as an average value of a frequency of the crystal grain size within a range of $R_{avg\_E1}$±about 2 nm is $B_{avg\_E1}$, and an average frequency B as an average value of a frequency of the crystal grain size within the range of $R_{Savg\_C}$±about 2 nm is $B_{Savg\_E1\text{-}C}$, and $H_{E1}=B_{avg\_E1}/B_{Savg\_E1\text{-}C}$ and $H_C=B_{avg\_C}/B_{Savg\_C}$ are satisfied, $H_{E1}>H_C$ is satisfied.

7. The acoustic wave device according to claim 6, wherein $H_{E1}>$about $1.5\times H_C$ is satisfied.

8. The acoustic wave device according to claim 1, wherein the first electrode and the second electrode are a pair of plate-shaped electrodes opposed to each other with the scandium-containing aluminum nitride film interposed therebetween; and the first electrode and the second electrode are structured to generate a bulk wave.

9. The acoustic wave device according to claim 1, wherein the first electrode is a plate-shaped electrode and the second electrode is an IDT electrode; and the second electrode is structured to generate a plate wave.

10. The acoustic wave device according to claim 1, further comprising:

a support substrate on one principal surface side of the scandium-containing aluminum nitride film; wherein a hollow portion is provided between the support substrate and the scandium-containing aluminum nitride film.

11. The acoustic wave device according to claim 1, further comprising:

a support substrate on one principal surface side of the scandium-containing aluminum nitride film; and an intermediate layer provided between the one principal surface of the scandium-containing aluminum nitride film and the support substrate.

12. The acoustic wave device according to claim 11, wherein the intermediate layer is an acoustic reflection layer.

13. The acoustic wave device according to claim 12, wherein the acoustic reflection layer includes a high acoustic impedance layer having relatively high acoustic impedance and a low acoustic impedance layer having relatively low acoustic impedance.

14. The acoustic wave device according to claim 1, wherein the acoustic wave device is a bulk acoustic wave device.

15. The acoustic wave device according to claim 1, wherein the first electrode and the second electrode include Ti, Mo, Ru, W, Al, Pt, Ir, Cu, Cr, or Sc, or an alloy thereof.

16. The acoustic wave device according to claim 1, wherein the first electrode and the second electrode include a multilayer body including metal films.

17. The acoustic wave device according to claim 10, wherein the support substrate includes an insulator or a semiconductor.

18. The acoustic wave device according to claim 10, wherein the support substrate includes an insulator or a semiconductor.

19. The acoustic wave device according to claim 1, wherein a thickness of each of the first electrode vicinity region and the second electrode vicinity region is in a range of about 5% or larger and about 25% or smaller of a thickness of the scandium-containing aluminum nitride film.

20. The acoustic wave device according to claim 9, wherein a portion of the IDT electrode overlaps with a hollow portion in a support substrate on one principal surface side of the scandium-containing aluminum nitride film.

* * * * *